United States Patent
Hsieh

(10) Patent No.: US 10,305,625 B2
(45) Date of Patent: May 28, 2019

(54) DATA RECOVERY CIRCUIT

(71) Applicant: Realtek Semiconductor Corp., Hsinchu (TW)

(72) Inventor: Yi-Chun Hsieh, Miaoli County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/976,412

(22) Filed: May 10, 2018

(65) Prior Publication Data
US 2018/0343080 A1    Nov. 29, 2018

(30) Foreign Application Priority Data
May 23, 2017   (TW) .............................. 106117000 A

(51) Int. Cl.
*H04L 1/00* (2006.01)
*H03K 5/24* (2006.01)

(52) U.S. Cl.
CPC .............. *H04L 1/0001* (2013.01); *H03K 5/24* (2013.01)

(58) Field of Classification Search
CPC ........................................................ H04L 7/033
USPC .................................. 375/316, 317, 318, 319
See application file for complete search history.

(56) References Cited

U.S. PATENT DOCUMENTS

| | | | |
|---|---|---|---|
| 5,654,987 A * | 8/1997 | Nakamura ............ | H03L 7/0807 375/294 |
| 8,630,373 B2 * | 1/2014 | Ko ........................ | H04L 7/0008 375/326 |
| 2016/0182260 A1 * | 6/2016 | Dong ................ | H04L 25/03057 375/233 |

* cited by examiner

*Primary Examiner* — Kevin Kim
(74) *Attorney, Agent, or Firm* — Birch, Stewart, Kolasch & Birch, LLP

(57) ABSTRACT

A data recovery circuit includes: a first comparison circuit for comparing two analog data signals to output a first and a second comparison signals having opposite logic values when a positive clock signal stays at an active level, and for configuring the first and second comparison signals to have a same logic value when the positive clock signal stays at an inactive level; a second comparison circuit for comparing the two analog data signals to output a third and a fourth comparison signals having opposite logic values when a negative clock signal stays at the active level, and for configuring the third and fourth comparison signals to have the same logic value when the negative clock signal stays at the inactive level; and a data signal generating circuit for generating a digital data signal according to the first through fourth comparison signals.

2 Claims, 5 Drawing Sheets

| CLK | CLKB | DIN | R1 | S1 | R2 | S2 |
|---|---|---|---|---|---|---|
| High | Low | Vip > Vin | High | Low | High | High |
| High | Low | Vip < Vin | Low | High | High | High |
| Low | High | Vip > Vin | High | High | High | Low |
| Low | High | Vip < Vin | High | High | Low | High |

FIG. 2

DATA RECOVERY CIRCUIT

CROSS-REFERENCE TO RELATED APPLICATIONS

This application claims the benefit of priority to patent application Ser. No. 10/611,7000, filed in Taiwan on May 23, 2017; the entirety of which is incorporated herein by reference for all purposes.

BACKGROUND

The disclosure generally relates to a data recovery circuit and, more particularly, to a data recovery circuit for preventing glitches from occurring in the digital data signal outputted form the data recovery circuit.

A multiplexer is typically employed in the conventional data recovery circuit to alternatively output the comparison results of different comparators. Due to the influence of process variation, operating voltage, temperature, or other factors, unexpected delay often occurs between the output signals of different comparators. Therefore, it is very difficult for a control circuit of the multiplexer to accurately control the switching timing of the multiplexer due to the above situation, thereby resulting in glitches in the output data signal.

SUMMARY

An example embodiment of a data recovery circuit for generating a digital data signal based on a differential data input signal constituted by a first analog data signal and a second analog data signal is disclosed, comprising: a first comparison circuit, arranged to operably compare the first analog data signal with the second analog data signal and to operably to output a first comparison signal and a second comparison signal having opposite logic values when a positive clock signal stays at an active level to reflect a comparison result of the first analog data signal and the second analog data signal, and arranged to operably configure the first comparison signal and the second comparison signal to have a same logic value when the positive clock signal stays at an inactive level; a second comparison circuit, arranged to operably compare the first analog data signal with the second analog data signal and to operably output a third comparison signal and a fourth comparison signal having opposite logic values when a negative clock signal stays at the active level to reflect a comparison result of the first analog data signal and the second analog data signal, and arranged to operably configure the third comparison signal and the fourth comparison signal to have a same logic value when the negative clock signal stays at the inactive level; and a data signal generating circuit, coupled with the first comparison circuit and the second comparison circuit, arranged to operably to generate the digital data signal according to the first comparison signal, the second comparison signal, the third comparison signal, and the fourth comparison signal. When the first comparison signal and the second comparison signal have opposite logic values while the third comparison signal and the fourth comparison signal have a same logic value, the data signal generating circuit configures the digital data signal to have a logic value the same as the first comparison signal. When the first comparison signal and the second comparison signal have a same logic value while the third comparison signal and the fourth comparison signal have opposite logic values, the data signal generating circuit configures the digital data signal to have a logic value the same as the third comparison signal. When the first comparison signal, the second comparison signal, the third comparison signal, and the fourth comparison signal become to have a same logic value, the data signal generating circuit maintains the logic value of the digital data signal unchanged. When the first comparison signal and the second comparison signal have opposite logic values but the third comparison signal and the fourth comparison signal transit from having the same logic value to having opposite logic values, the data signal generating circuit maintains the logic value of the digital data signal unchanged.

Both the foregoing general description and the following detailed description are examples and explanatory only, and are not restrictive of the invention as claimed.

BRIEF DESCRIPTION OF THE DRAWINGS

FIG. 2 shows a simplified schematic diagram of the logic relationship among signals of the data recovery circuit of FIG. 1 according to one embodiment of the present disclosure.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
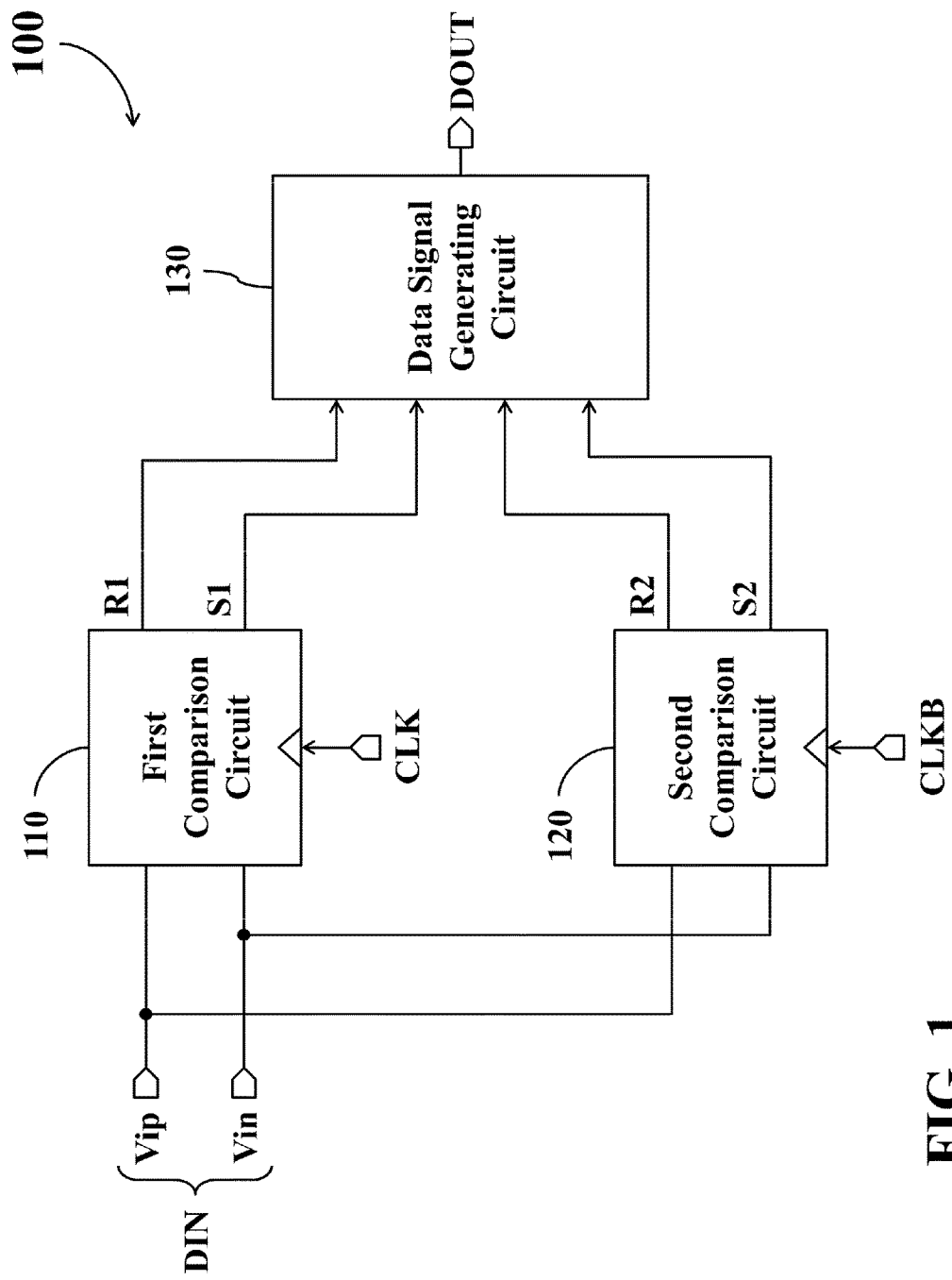
FIG. 1 shows a simplified functional block diagram of a data recovery circuit according to one embodiment of the present disclosure.

Please refer to FIG. 1 and FIG. 2. FIG. 1 shows a simplified functional block diagram of a data recovery circuit 100 according to one embodiment of the present disclosure. FIG. 2 shows a simplified schematic diagram of the logic relationship among signals of the data recovery circuit 100 according to one embodiment of the present disclosure.

The data recovery circuit 100 is arranged to operably generate a digital data signal DOUT based on a differential data input signal DIN constituted by two analog data signals Vip and Vin.

As shown in FIG. 1, the data recovery circuit 100 comprises a comparison circuit 110, a comparison circuit 120, and a data signal generating circuit 130.

The comparison circuit 110 operates based on a positive clock signal CLK, while the comparison circuit 120 operates based on a negative clock signal CLKB. The positive clock signal CLK and the negative clock signal CLKB have the same frequency but opposite polarities. In addition, the frequency of the positive clock signal CLK is half of the frequency of the differential data input signal DIN, and the frequency of the negative clock signal CLKB is also half of the frequency of the differential data input signal DIN.

For illustrative purpose, it is assumed hereafter that both the positive clock signal CLK and the negative clock signal CLKB are active high signals. Since the positive clock signal CLK and the negative clock signal CLKB have opposite polarities, when the positive clock signal CLK stays at an active level (e.g., the logic high level), the negative clock signal CLKB would stay at an inactive level (e.g., the logic low level). On the other hand, when the positive clock signal CLK stays at an inactive level (e.g., the logic low level), the negative clock signal CLKB would stay at an active level (e.g., the logic high level).

The aforementioned positive clock signal CLK and negative clock signal CLKB may be instead realized with active low signals. In this situation, the control logic of relevant switches should be modified adaptively.

The comparison circuit 110 is arranged to operably compare the analog data signal Vip with the analog data signal Vin. When the positive clock signal CLK stays at the active level, the comparison circuit 110 outputs the comparison signals R1 and S1 with opposite logic values to reflect the comparison result of the analog data signals Vip and Vin. In addition, when the positive clock signal CLK stays at the inactive level, the comparison circuit 110 configures the comparison signals R1 and S1 to have the same logic value so as to render the logic values of the comparison signals R1 and S1 to be irrelevant to the comparison result of the analog data signals Vip and Vin.

The comparison circuit 120 is arranged to operably compare the analog data signal Vip with the analog data signal Vin. When the negative clock signal CLKB stays at the active level, the comparison circuit 120 outputs the comparison signals R2 and S2 with opposite logic values to reflect the comparison result of the analog data signals Vip and Vin. In addition, when the negative clock signal CLKB stays at the inactive level, the comparison circuit 120 configures the comparison signals R2 and S2 to have the same logic value so as to render the logic values of the comparison signals R2 and S2 to be irrelevant to the comparison result of the analog data signals Vip and Vin.

The data signal generating circuit 130 is coupled with the comparison circuits 110 and 120, and arranged to operably generate the digital data signal DOUT according to the comparison signals R1, S1, R2, and S2.

Configuration of the output logic of the comparison circuit 110 and the comparison circuit 120 may be realized with the example shown in FIG. 2.

Figure 3:
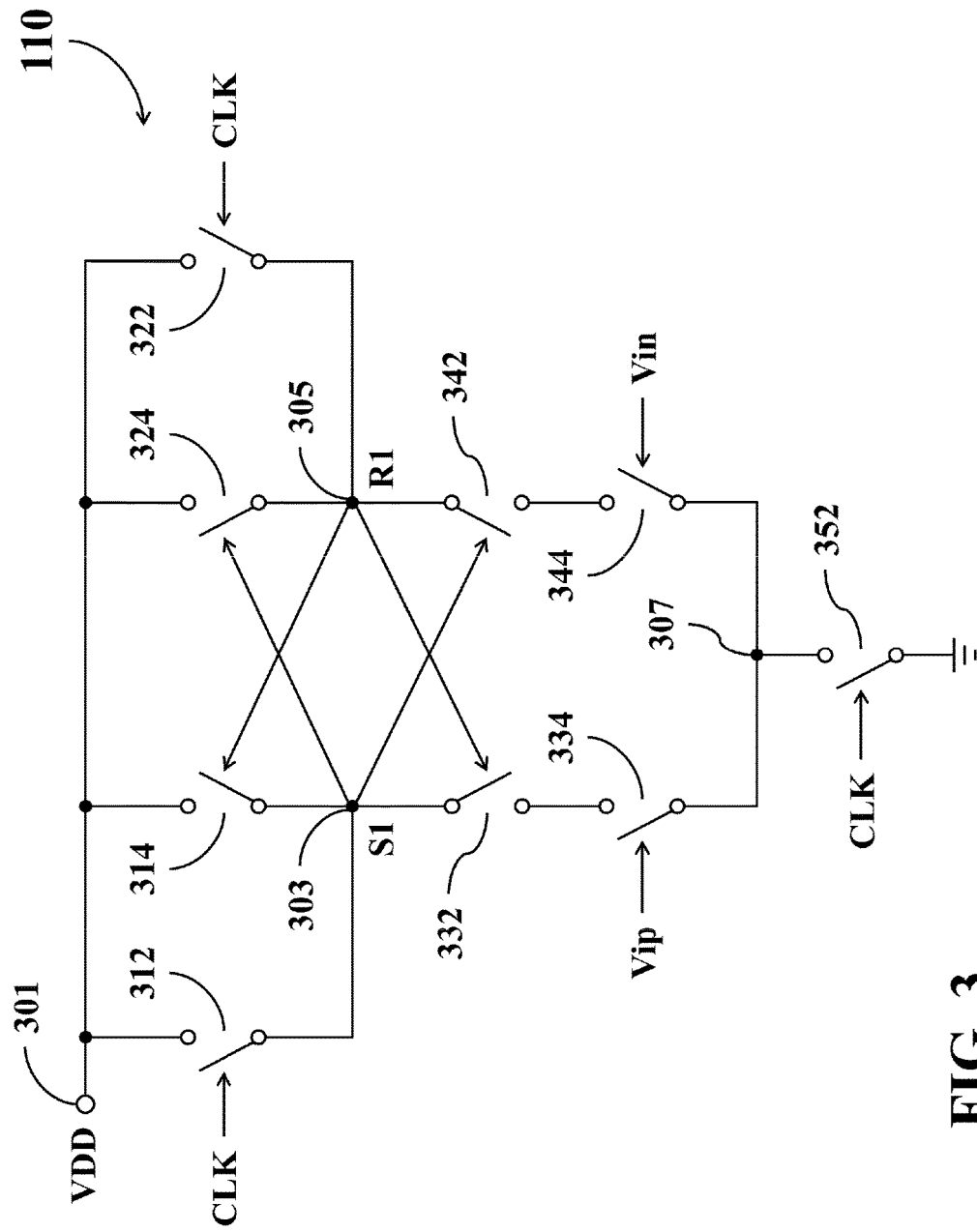
FIG. 3 shows a simplified functional block diagram of a first comparison circuit in FIG. 1 according to one embodiment of the present disclosure.
Figure 4:
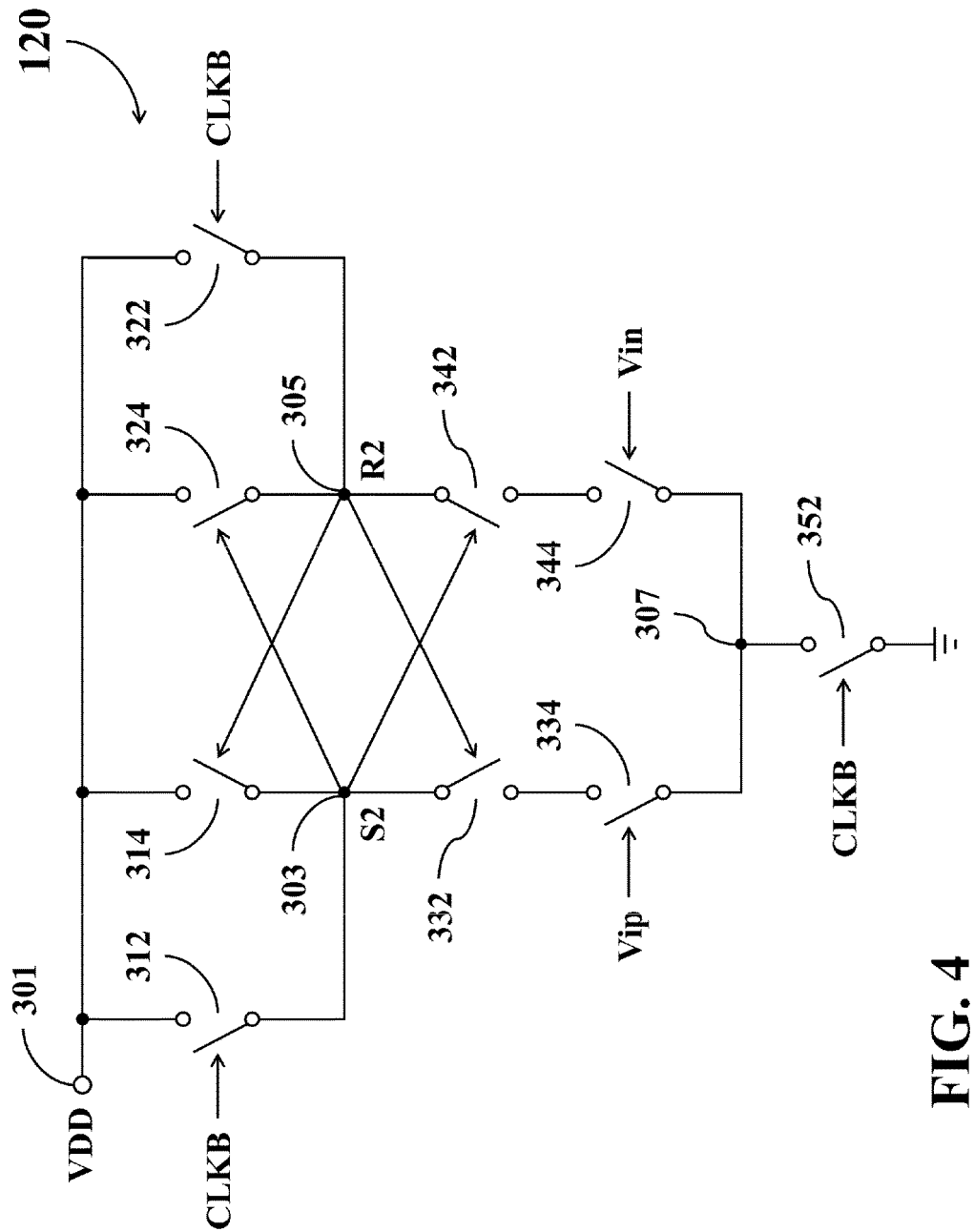
FIG. 4 shows a simplified functional block diagram of a second comparison circuit in FIG. 1 according to one embodiment of the present disclosure.

Please refer to FIG. 3 and FIG. 4. FIG. 3 shows a simplified functional block diagram of the comparison circuit 110 according to one embodiment of the present disclosure. FIG. 4 shows a simplified functional block diagram of the comparison circuit 120 according to one embodiment of the present disclosure.

In the embodiment of FIG. 3, a node 303 may be utilized to provide the aforementioned comparison signal S1, while a node 305 may be utilized to provide the aforementioned comparison signal R1.

As shown in FIG. 3, switches 312 and 314 are coupled between the voltage input terminal 301 and the node 303 in a parallel connection configuration. Switches 322 and 324 are coupled between the voltage input terminal 301 and the node 305 in a parallel connection configuration. Switches 332 and 334 are coupled between the node 303 and the node 307 in a series connection configuration, and the positions of the switches 332 and 334 may be swapped with each other. Switches 342 and 344 are coupled between the node 305 and the node 307 in a series connection configuration, and the positions of the switches 342 and 344 may be swapped with each other. A switch 352 is coupled between the node 307 and a fixed-voltage terminal (e.g., a grounded terminal).

Each of the switches 312, 322, and 352 operates under control of the positive clock signal CLK. Each of the switches 314 and 332 operates under control of the comparison signal R1. Each of the switches 324 and 342 operates under control of the comparison signal S1. The switch 334 operates under control of the analog data signal Vip. The switch 344 operates under control of the analog data signal Vin.

The circuit structure of the embodiment in FIG. 4 is similar with the embodiment in FIG. 3. One difference between the two embodiments is that each of the switches 312, 322, and 352 in FIG. 4 operates under control of the negative clock signal CLKB instead of the positive clock signal CLK. Another difference between the two embodiments is that the node 303 in FIG. 4 is utilized to provide the aforementioned comparison signal S2, while the node 305 is utilized to provide the aforementioned comparison signal R2.

In practice, each switch in FIG. 3 and FIG. 4 may be realized with an appropriate transistor. For example, each of the switches 312, 314, 322, and 324 may be realized with a P-type transistor, while each of the switches 332, 334, 342, 344, and 352 may be realized with an N-type transistor.

In order to prevent glitches from occurring in the digital data signal DOUT, the data signal generating circuit 130 adjusts the configuration of the digital data signal DOUT based on the logic value combination of the comparison signals R1, S1, R2, and S2.

Specifically, when the comparison signals R1 and S1 have opposite logic values while the comparison signals R2 and S2 have the same logic value, the data signal generating circuit 130 configures the digital data signal DOUT to have a logic value the same as the comparison signal R1.

When the comparison signals R1 and S1 have the same logic value while the comparison signals R2 and S2 have opposite logic values, the data signal generating circuit 130 configures the logic value of the digital data signal DOUT to have a logic value the same as the comparison signal R2.

When the comparison signals R1, S1, R2, and S2 become to have the same logic value, the data signal generating circuit 130 maintains the logic value of the digital data signal DOUT unchanged, so that the digital data signal DOUT has the same logic value as the prior stage.

In addition, when the comparison signals R1 and S1 have opposite logic values but the comparison signals R2 and S2 transit from having the same logic value to having opposite logic values, the data signal generating circuit 130 maintains the logic value of the digital data signal DOUT unchanged, so that the digital data signal DOUT has the same logic value as the prior stage.

Please note that when the comparison signals R1, S1, R2, and S2 become to have the same logic value, it means that the current logic value of the comparison signals R1, S1, R2, and S2 is irrelevant to the comparison result of the analog data signals Vip and Vin.

In addition, when the comparison signals R1 and S1 have opposite logic values but the comparison signals R2 and S2 transit from having the same logic value to having opposite logic values, it means that the current comparison signals R1 and S1 are presenting the comparison result of the comparison circuit 110, and the current comparison signals R2 and S2 are presenting the comparison result of the comparison circuit 120.

The above two situations should not appear in an ideal environment. It is highly likely that the presence of the above two situations is caused by a difference between the delay of the output signal of the comparison circuit 110 and the delay of the output signal of the comparison circuit 120. The above delay difference between the output signals of the comparison circuits 110 and 120 is typically affected by the process variation, operating voltage, temperature, or other factors.

As described previously, when the logic value combination of the comparison signals R1, S1, R2, and S2 is one of the two aforementioned situations, the data signal generating circuit 130 maintains the logic value of the resulting digital data signal DOUT to be the same as that in the prior status. In this way, erroneous operation of the data recovery circuit 100 can be avoided, thereby effectively preventing glitches form occurring in the resulting digital data signal DOUT.

Figure 5:
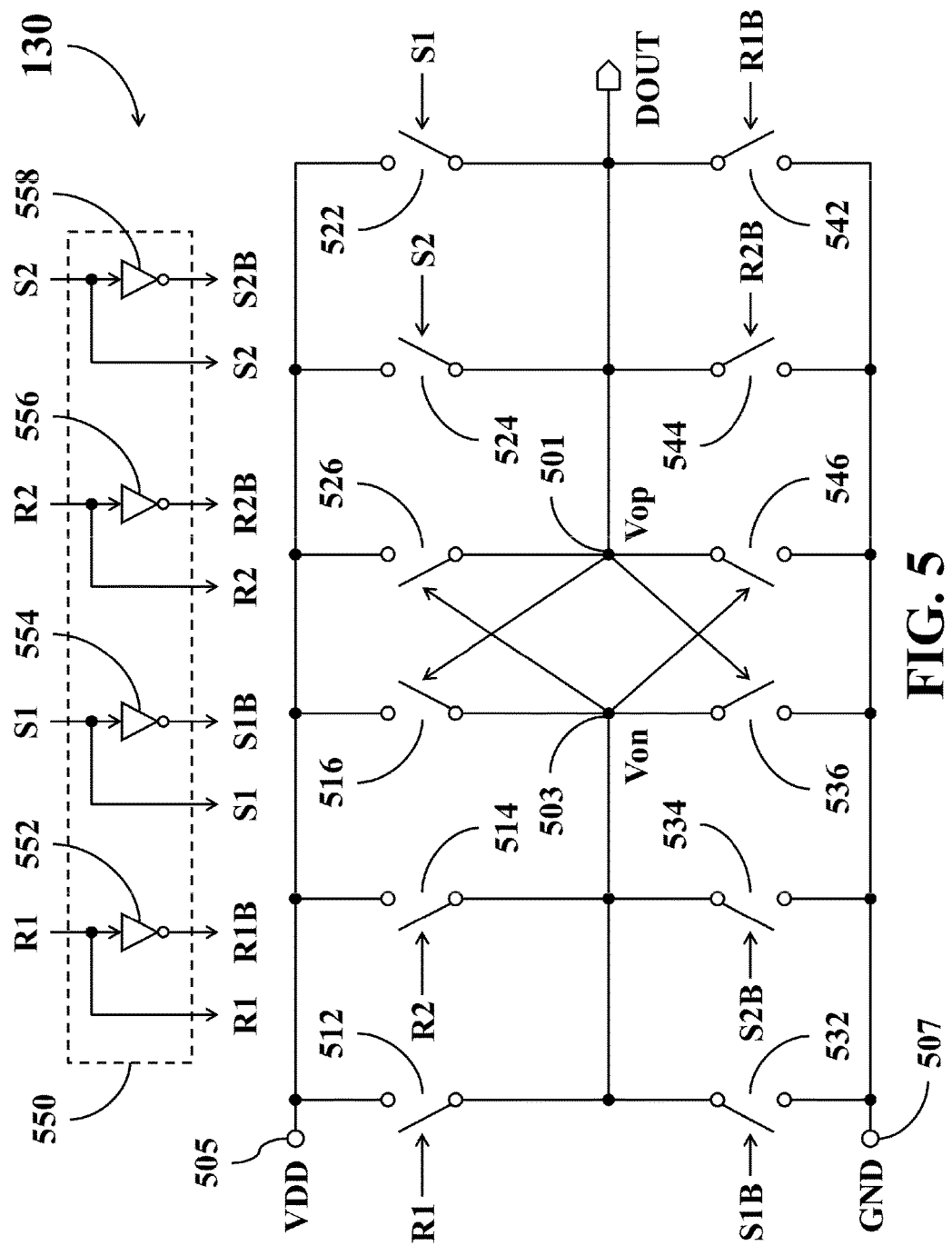
FIG. 5 shows a simplified functional block diagram of a data signal generating circuit in FIG. 1 according to one embodiment of the present disclosure.

FIG. 5 shows a simplified functional block diagram of the data signal generating circuit 130 according to one embodiment of the present disclosure. In FIG. 5, a first node 501 is utilized to provide a first node voltage Vop as the digital data signal DOUT. A second node 503 is utilized to provide a second node voltage Von having a polarity opposite to the polarity of the first node voltage Vop.

As shown in FIG. 5, switches 512, 514, and 516 are coupled between a voltage input terminal 505 and the second node 503 in a parallel connection configuration. Switches 522, 524, and 526 are coupled between the voltage input terminal 505 and the first node 501 in a parallel connection configuration. Switches 532, 534, and 536 are coupled between the second node 503 and a fixed-voltage terminal 507 in a parallel connection configuration. Switches 542, 544, and 546 are coupled between the first node 501 and the fixed-voltage terminal 507 in a parallel connection configuration. Each of the switches 516 and 536 operates under control of the first node voltage Vop, while each of the switches 526 and 546 operates under control of the second node voltage Von.

A control circuit 550 is arranged to operably control the switches 512 and 542 based on the comparison signal R1, to operably control the switches 522 and 532 based on the comparison signal S1, to operably control the switches 514 and 544 based on the comparison signal R2, and to operably control the switches 524 and 534 based on the comparison signal S2.

In the data signal generating circuit 130, the control circuit 550 synchronously turns on the switches 512 and 542, and synchronously turns off the switches 512 and 542. The control circuit 550 synchronously turns on the switches 514 and 544, and synchronously turns off the switches 514 and 544. The control circuit 550 synchronously turns on the switches 522 and 532, and synchronously turns off the switches 522 and 532. In addition, the control circuit 550 synchronously turns on the switches 524 and 534, and synchronously turns off the switches 524 and 534.

If the control logics of the switches 512 and 542 are opposite to each other, the control logics of the switches 514 and 544 are opposite to each other, the control logics of the switches 522 and 532 are opposite to each other, while the control logics of the switches 524 and 534 are opposite to each other, then the control circuit 550 may utilize four inverters 552, 554, 556, and 558 as shown in FIG. 5 to realize the aforementioned switch control mechanism.

Each switch in FIG. 5 may be realized with an appropriate transistor. For example, each of the switches 512, 514, 516, 522, 524, and 526 may be realized with a P-type transistor, while each of the switches 532, 534, 536, 542, 544, and 546 may be realized with an N-type transistor.

In addition, the control circuit 550 in FIG. 5 or the inverters 552, 554, 556, and 558 in the control circuit 550 may be omitted to simplify the circuitry complexity by appropriately choosing the transistor type of each switch in FIG. 5. For example, each of the switches 512 and 542 may operate under control of the comparison signal R1, each of the switches 514 and 544 may operate under control of the comparison signal R2, each of the switches 522 and 532 may operate under control the comparison signal S1, and each of the switches 524 and 534 may operate under control the comparison signal S2. In this situation, the control circuit 550 can be omitted.

Since the data recovery circuit 100 does not utilize a conventional multiplexer to generate the digital data signal DOUT, no complex control circuit is required for controlling the switching timing of the conventional multiplexer. Therefore, the control complexity of the overall circuit can be effectively reduced.

Additionally, when the logic value combination of the comparison signals R1, S1, R2, and S2 matches with predetermined patterns, the data signal generating circuit 130 would maintain the logic value of the resulting digital data signal DOUT unchanged to thereby prevent glitches from occurring in the digital data signal DOUT.

Furthermore, the data signal generating circuit 130 does not need to consider the delay difference between the output signals of the comparison circuits 110 and 120 at all, and thus the data signal generating circuit 130 can be realized with a very simplified combination of switches. Accordingly, the required circuit area can be effectively reduced.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A data recovery circuit (100) for generating a digital data signal (DOUT) based on a differential data input signal (DIN) constituted by a first analog data signal (Vip) and a second analog data signal (Vin), the data recovery circuit (100) comprising:
   a first comparison circuit (110), arranged to operably compare the first analog data signal (Vip) with the second analog data signal (Vin) and to operably to output a first comparison signal (R1) and a second comparison signal (S1) having opposite logic values when a positive clock signal (CLK) stays at an active level to reflect a comparison result of the first analog data signal (Vip) and the second analog data signal (Vin), and arranged to operably configure the first comparison signal (R1) and the second comparison signal (S1) to have a same logic value when the positive clock signal (CLK) stays at an inactive level;
   a second comparison circuit (120), arranged to operably compare the first analog data signal (Vip) with the second analog data signal (Vin) and to operably output a third comparison signal (R2) and a fourth comparison signal (S2) having opposite logic values when a negative clock signal (CLKB) stays at the active level to reflect a comparison result of the first analog data signal (Vip) and the second analog data signal (Vin), and arranged to operably configure the third comparison signal (R2) and the fourth comparison signal (S2) to have a same logic value when the negative clock signal (CLKB) stays at the inactive level; and
   a data signal generating circuit (130), coupled with the first comparison circuit (110) and the second comparison circuit (120), arranged to operably to generate the digital data signal (DOUT) according to the first comparison signal (R1), the second comparison signal (S1), the third comparison signal (R2), and the fourth comparison signal (S2);

wherein when the first comparison signal (R1) and the second comparison signal (S1) have opposite logic values while the third comparison signal (R2) and the fourth comparison signal (S2) have a same logic value, the data signal generating circuit (130) configures the digital data signal (DOUT) to have a logic value the same as the first comparison signal (R1);

when the first comparison signal (R1) and the second comparison signal (S1) have a same logic value while the third comparison signal (R2) and the fourth comparison signal (S2) have opposite logic values, the data signal generating circuit (130) configures the digital data signal (DOUT) to have a logic value the same as the third comparison signal (R2);

when the first comparison signal (R1), the second comparison signal (S1), the third comparison signal (R2), and the fourth comparison signal (S2) become to have a same logic value, the data signal generating circuit (130) maintains the logic value of the digital data signal (DOUT) unchanged; and when the first comparison signal (R1) and the second comparison signal (S1) have opposite logic values but the third comparison signal (R2) and the fourth comparison signal (S2) transit from having the same logic value to having opposite logic values, the data signal generating circuit (130) maintains the logic value of the digital data signal (DOUT) unchanged.

2. The data recovery circuit (100) of claim 1, wherein a frequency of the positive clock signal (CLK) is half of a frequency of the differential data input signal (DIN), and a frequency of the negative clock signal (CLKB) is also half of the frequency of the differential data input signal (DIN).

* * * * *